United States Patent [19]

Tamamura

[11] Patent Number: 4,748,403

[45] Date of Patent: May 31, 1988

[54] APPARATUS FOR MEASURING CIRCUIT ELEMENT CHARACTERISTICS WITH VHF SIGNAL

[75] Inventor: Toshio Tamamura, Hachioji, Japan

[73] Assignee: Hewlett-Packard Company, Palo Alto, Calif.

[21] Appl. No.: 826,473

[22] Filed: Feb. 5, 1986

[51] Int. Cl.$^4$ .............................................. G01R 1/30
[52] U.S. Cl. ................................... 324/73 R; 330/69; 330/258
[58] Field of Search ................ 324/73 R; 330/69, 258

[56] References Cited

U.S. PATENT DOCUMENTS

| | | |
|---|---|---|
| 3,602,809 | 8/1971 | Tarui et al. ........................ 324/73 R |
| 3,699,469 | 10/1972 | Elazar .................................... 330/69 |
| 3,849,726 | 11/1974 | Justice ................................ 324/73 R |
| 4,075,623 | 2/1978 | Futagawa et al. ................ 324/73 R |

OTHER PUBLICATIONS

"Amplifier with High Common Mode Input Impedance", by Bakke et al., IBM Tech. Disc. Bull., vol. 8, #9, 2/66, p. 1299.

"A Wideband, Isolated Amplifier for Biological Signals", by Smallwood, Electronic Engineering, Mid-Apr. '78, V. 50, #605.

"High-Performance Input Stage for Integrated Operational Amplifiers", by Jaeger, IBM Tech. Disc. Bull., vol 18, #6, 11/75, p. 1695.

Primary Examiner—Reinhard J. Eisenzopf
Assistant Examiner—William J. Burns
Attorney, Agent, or Firm—James M. Williams

[57] ABSTRACT

Apparatus for measuring the A.C. characteristics of an electronic circuit under test having signal generators and a signal measuring device synchronized by a clock signal from a control device. The signal generators and the control device are electrically isolated from the measurement device so that reference potential fluctuations in the signal generators or in the control device do not affect the measurement. The synchronizing clock signal is transmitted from the signal generators to the measurement device through a shielded twisted pair cable terminated at each end by a high impedence connection.

1 Claim, 2 Drawing Sheets

APPARATUS FOR MEASURING CIRCUIT ELEMENT CHARACTERISTICS WITH VHF SIGNAL

BACKGROUND OF THE INVENTION

The present invention relates generally to the evaluation of circuit element characteristics, e.g. capacitance, resistance and inductance, of integrated circuits (ICs) and various other kinds of electronic devices, and relates more particularly to improper signal transmission between components in devices for evaluating such characteristics.

FIG. 2 shows an example of prior art apparatus for measuring circuit element characteristics that is specifically arranged to obtain IC characteristics. Control device 101, which may be a computer, has input/output terminals 106, 107 and 108 which are connected through optical fiber cables 115, 116 and 117 respectively to a terminal 109 of a signal generating device 102, to a terminal 110 of signal measuring device 103 and, to a terminal 111 of pulse generating device 104. Signal generating device 102, signal measuring device 103 and pulse generating device 104 are connected to a circuit 105 to be tested in order to measure the values of applied voltage and current flowing within circuit 105. The connections from devices 102, 103 and 104 to circuit 105 are made via coaxial cables 118, 119 and 120 which connect terminals 112, 113 and 114 to the measurement terminals 121, 122 and 123 of circuit 105. Control device 101 is connected to ground via a power source (not shown in FIG. 2). The chassis of signal generating device 102, signal measuring device 103 and pulse generating device 104 are connected to each other, and the assembly is connected to a common ground through a power source (not shown in FIG. 2), so that the reference potential of signal generating device 102, measuring device 103, and pulse generating device 104 is nominally the same. The circuit 105, the device under test, is also connected to ground.

The apparatus shown in FIG. 2 operates as follows. To measure the A.C. characteristics, e.g. capacitance, inductance and resistance, of circuit 105, first of all, control device 101 sends a control signal to signal generating device 102 through optical fiber cable 115. In response to the control signal, signal generating device 102 provides an A.C. signal with a predetermined frequency to circuit 105 through cable 118. Control device 101 also sends a control signal to signal measuring device 103 through optical fiber cable 116, directing device 103 to measure the voltage produced in circuit 105. The measurement data is transmitted to control device 101 for further calculation to obtain the A.C. characteristics of circuit 105, also via optical fiber cable 116.

To measure digital characteristics, e.g. slew rate or threshold level, pulse generating device 104 is used to produce the test signal applied to circuit 105, and a coordinated measurement of the response is made by device 103 in a manner similar to the one used for A.C. measurements, above. The pulse generating device 104 is connected to circuit 105 via wire 120.

Measurement error can be introduced by fluctuations of the reference potential transferred between control device 101, signal generating device 102, signal measuring device 103 and pulse generating device 104. When several devices are connected to a common reference potential, the fluctuation of a reference potential in one device can cause voltage noise which may transfer to the other devices as a voltage drop caused by current flowing through wires connecting the devices. These fluctuations make it impossible to measure circuit characteristics of a device under test with high accuracy.

In order to prevent such measurement error, optical fiber cables can be used to electrically isolate two devices, while transmitting signals between them. Thus, in FIG. 2, optical fiber cables 115-117 prevent transfer of ground potential voltage fluctuations from control device 101 to signal generating device 102, signal measuring device 103 and pulse generating device 104. The photocouplers which send and receive the optical signals through the optical cable have response characteristics suitable for digital signals which are not adversely affected by any distortion of the waveform or noise. They are not suitable, however, for synchronizing signals and measuremnt signals, especially wide band high frequency AC signals, which are adversely affected by noise and waveform distortion and thus cannot be transmitted over optical fiber cables. Therefore, optical fiber cables cannot be used to replace the coaxial cables 118-120 used in prior art for transmitting the high frequency test signal or the measurement signals which are typically in the VHF band.

Since signal generating device 102, signal measuring device 103, pulse generating device 104 and circuit 105 remain connected to a common reference potential and connected to device 105 through the outer conductors of coaxial cables 118, 119 and 120, the measurement accuracy may be degraded by reference potential fluctuations in any of these devices.

One method for lessening the effect of reference potential noise is to use shielded twisted pair cables conveying signals in balanced mode in place of the coaxial cables 118, 119 and 120. At one end of the shielded pair cable, the shielding outer conductor is not connected and the twisted pair is terminated by an isolation pulse transformer. This method is of limited application, however, because its narrow bandwidth for signal transmission. The isolation transformer limits bandwidth to 2-3 decades, too narrow for measuring IC characteristics.

Another method uses balanced signal transmission emitter-coupled logic (ECL) circuits to terminate the cables. The disadvantage of this method is its low common mode impedance because of the low terminating resistance of ECL circuits.

BRIEF SUMMARY OF THE INVENTION

The primary object of the present invention is to provide apparatus for measuring circuit element characteristics with high accuracy which is not affected by noise occuring on the signal transmission lines for high frequency clock signals and for high frequency AC test signals during the measurement. In accordance with this invention, the wide band high frequency signals are transmitted without deterioration over a high common mode impedance cable by providing a receiver with high common mode impedance and high normal mode impedance.

The preferred embodiment of this invention comprises a signal generator, a pulse generator and a measurement device, e.g. for measuring voltage, with the measurement device connected to the signal generator and pulse generator by shielded twisted pair cables terminated with high impedance balanced ECL (emitter-coupled logic) circuits so there is no net current flow through the twisted pair or through the shielding conductor either into or out of the measuring device.

DESCRIPTION OF THE PREFERRED EMBODIMENT

Figure 1:
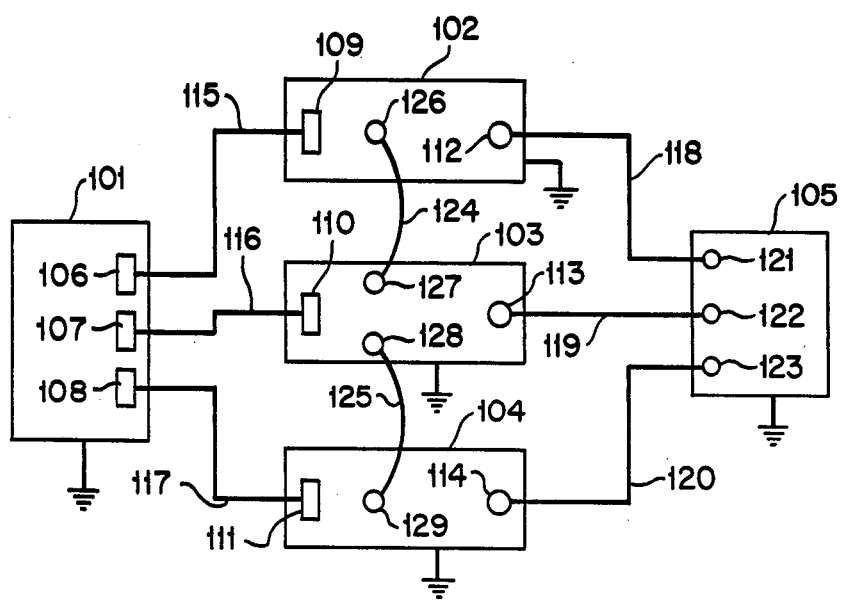
FIG. 1 is a schematic block diagram of an apparatus for measuring circuit element characteristics with VHF test signals constructed in accordance with the invention.
Figure 2:
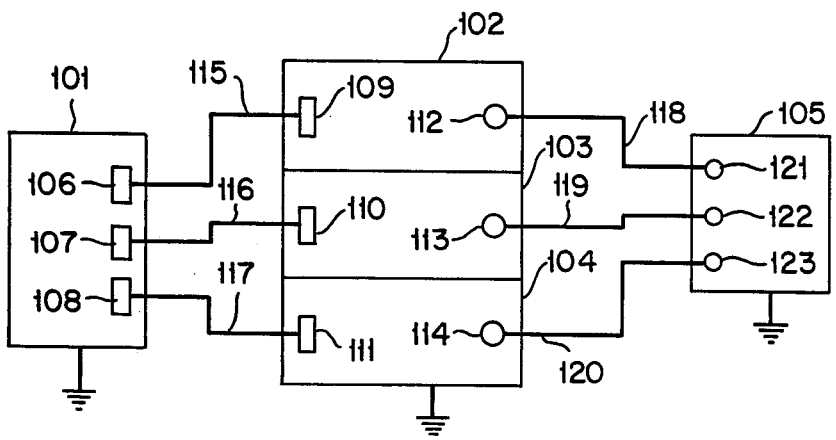
FIG. 2 is a schematic block diagram of an apparatus for measuring circuit element characteristics known in the prior art.
Figure 3:
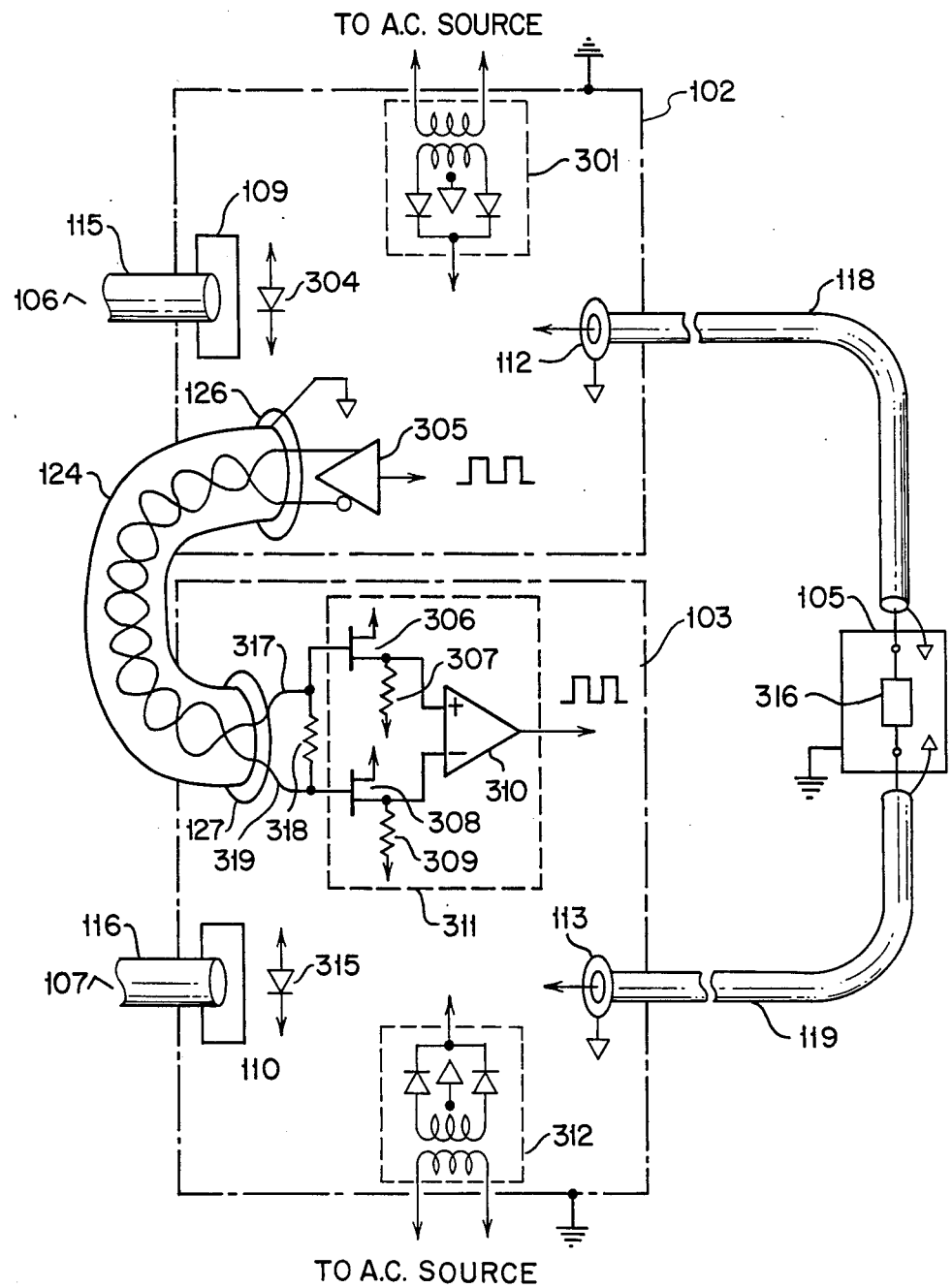
FIG. 3 is a more detailed illustration of certain elements of FIG. 1 to explain the electrical isolation of the measurement apparatus from the other devices of FIG. 1.

FIG. 1 shows the preferred embodiment of this invention for measuring circuit element characteristics such as VHF signal response. The elements of FIG. 1 which serve the same function as elements of FIG. 2 are designated by the same reference numbers used in FIG. 2. The device of FIG. 1 differs from the prior art in that: (1) Signal generating device 102 and pulse generating device 104 are connected to signal measuring device 103 by shielded twisted pair cables 124 and 125 between terminals 126, 127 and 128, 129. (2) The signal transmitter and receiver circuits in signal generating device 102, signal measuring device 103 and pulse generating device 103 do not allow any net current flow through cables 124 and 125.

The purpose of twisted pair cables 124 and 125 is to transmit synchronizing signals to measuring device 103 from signal generating device 102 and from pulse generating device 104 for circuit element characteristics measurements. In order to perform precise measurements, it is necessary to transmit VHF signals with well defined timing. Optical fiber cables are not suitable for transmitting the necessary wide band high frequency synchronizing signals. In response to a control signal from control device 101, signal generating device 102 generates an A.C. test signal with predetermined frequency at terminal 112 and also generates, at terminal 126, a clock signal synchronized with the A.C. test signal. The A.C. test signal is applied to circuit 105.

Signal measuring device 103, on the other hand, samples the voltage occurring within circuit 105 in response to a control signal from control device 101 and also in response to the synchronizing clock signal from signal generating device 102. The measurement data are stored temporarily in a memory of signal measuring device 103. The data stored in signal measuring device 103 is transmitted through optical fiber cable 116 to control device 101 for processing to calculate circuit element characteristics, using discreet fourier transforms or other processing methods which are beyond the scope of this application. Accordingly, the circuit element characteristics of circuit 105 can be determined.

For measuring the digital characteristics of circuit 105, pulse generating device 104 provides various kinds of pulse waveforms to circuit 105 and simultaneously provides a synchronizing clock pulse signal to signal measuring device 103 via shielded twisted pair cable 125. The digital characteristics of circuit 105 can be determined with the same procedure as described above with respect to the measurement operation for A.C. characteristics.

Although signal generating device 102, signal measuring device 103, pulse generating device 103 and circuit 105 are interconnected with electrical conductors, reference potential fluctuations in one device are not transferred to the other devices, in particular the signal measuring device 103. The preferred embodiment of the invention prevents such transfer by providing high impedance terminations for the interconnecting cables at each device, as described more fully below.

Control signals from control device 101 are received by device 102 through optical fiber 115 at terminal 109 connected to photocoupler 304, and by device 103 through optical fiber 116 at terminal 110 connected to photocoupler 315. Independent power sources 301 and 312 are respectively used for signal generating device 102 and signal measuring device 103, so that their ground connections do not provide a loop by which measurement error could be caused by reference potential noise. However, signal generating device 102 and signal measuring device 103 are still connected as a loop via wires 118 and 119 to circuit 316 and the twisted pair conductors of cable 121. Thus, reference potential noise in one device can cause unfavorable effects in the other devices.

In order to eliminate the propagation of reference potential noise, high input impedance FETs 306 and 308 are used to terminate twisted pair conductors 317 and 319 at signal measuring device 103. This high impedance termination prevents current flow between generating device 102 and signal measuring device 103, and effectively breaks the connection so that signal measuring device 103 is not affected by reference potential fluctuation in the other devices. The outer shielding conductor of cable 124 is grounded at device 102, but not connected to device 103. This connection allows balanced mode synchronizing signals to be transmitted between signal generating device 102 and signal measuring device 103 over cable 121. Operational amplifier 305 and comparator 311 are balanced ECL circuits. Operational amplifier 305 produces a balanced synchronizing signal which is transmitted to signal measuring device 103 over twisted pair 317 and 319. Comparator 311 receives the synchronizing signal and produces an output proportional to the differential signal between twisted pair conductors 317 and 319. Any common mode signals are rejected and do not affect the normal biasing condition of FETs 306 and 307. Thus any reference potential fluctuations occurring in signal generating device 102 do not propagate to signal measuring device 103. The connection between signal measuring device 103 and pulse generating device 104 may also be made in this manner to prevent reference noise from device 104 from affecting device 103.

The high impedance connecting circuits described can also be used for connecting the signal generating device 102 signal measuring device 103 and pulse generating device 104 to the circuit 105 under test.

Although the preferred embodiment is described in terms of a circuit measuring device, the present invention can be applied to transmission of wide band high frequency signals between various other types of devices.

I claim:

1. Apparatus for measuring circuit characteristics of a device under test comprising:

signal generating means, connected to ground, for providing an input signal to the device under test;

signal measuring means, connected to ground, for measuring an output signal from the device under test in response to the input signal;

first connecting means for connecting the signal generating means to the signal measuring means, having a high common mode rejection and capable of transmitting wide band high frequency signals with substantially no net current flow, said first connecting means comprising a shielded twisted pair cable, a balanced ECL receiver in the signal measuring means, and high impedence transistors connected between the twisted pair cable and the receiver for terminating the twisted pair cable and generating an input signal for the receiver;

second connecting means for connecting the signal generating means and the signal measuring means to the device under test, having a wide band signal path a common grounding paths;

wherein the shield for the twisted pair cable is connected at only one of the signal generating means or the signal measuring means so that there is no ground loop connecting the signal generating means, the signal measuring means and the device under test, and reference potential fluctuations are not propagated between the signal generating means and the signal measuring means.

* * * * *